(12) United States Patent
Sagues et al.

(10) Patent No.: US 6,242,879 B1
(45) Date of Patent: Jun. 5, 2001

(54) TOUCH CALIBRATION SYSTEM FOR WAFER TRANSFER ROBOT

(75) Inventors: Paul Sagues, Ross; Robert T. Wiggers, San Francisco; Steven M. Kraft, Berkeley, all of CA (US)

(73) Assignee: Berkeley Process Control, Inc., Richmond, CA (US)

( * ) Notice: Subject to any disclaimer, the term of this patent is extended or adjusted under 35 U.S.C. 154(b) by 0 days.

(21) Appl. No.: 09/524,025

(22) Filed: Mar. 13, 2000

(51) Int. Cl.$^7$ .................................................. G03B 19/10
(52) U.S. Cl. ............... 318/567; 318/568.11; 318/568.12; 318/568.21; 318/568.1; 901/2; 901/14; 901/30
(58) Field of Search ................................ 318/567, 568.1, 318/568.11, 568.12, 568.13, 568.16, 568.17, 568.18, 568.19, 568.21, 574; 901/2–4, 9–10, 14–18, 30–31

(56) References Cited

U.S. PATENT DOCUMENTS

| | | | |
|---|---|---|---|
| Re. 36,929 | * 10/2000 | Takayama et al. | 318/568.11 |
| 5,155,423 | * 10/1992 | Karlen et al. | 318/568.11 |
| 5,214,362 | * 5/1993 | Torii et al. | 318/567 |
| 5,442,269 | * 8/1995 | Takayama et al. | 318/568.11 |
| 5,581,166 | * 12/1996 | Eismann et al. | 318/568.18 |
| 5,789,890 | * 8/1998 | Genov et al. | 318/567 |
| 6,037,733 | * 3/2000 | Genov et al. | 318/568.11 |
| 6,121,743 | * 9/2000 | Genov et al. | 318/568.11 |

* cited by examiner

Primary Examiner—Robert E. Nappi
Assistant Examiner—Marlon Fletcher
(74) Attorney, Agent, or Firm—Pillsbury Winthrop; David H. Jaffer (57) ABSTRACT

A method and apparatus for automatically calibrating the precise positioning of a wafer handling robot relative to a target structure is disclosed. The apparatus comprises a machine controller connected to robot having an end-effector with three degrees of movement. The controller has a memory with stored rough distance and geometrical data defining the general location of structural features of the target structure. The robot is programmed to move toward the target structure in a series of sequential movements, each movement culminating with the robot end-effector touching a preselected exterior feature of the target structure. Each touching of the end-effector is sensed and provides data for the controller which then calculates the precise location of the target structure. The data accumulated during a series of touching steps by the robot end-effector is utilized by the controller to provide a precise calibrated control program for future operation of the robot.

13 Claims, 10 Drawing Sheets

TOUCH CALIBRATION SYSTEM FOR WAFER TRANSFER ROBOT

This invention relates to control systems for robots, and more particularly to a method and apparatus for automatically calibrating or "teaching" a robot to position itself at a plurality of pre-selected positions.

BACKGROUND OF THE INVENTION

In fabricating semiconductors, silicon wafers are often held in a cassette and then moved to various pre-programmed processing locations by a robotic handling system. The latter typically includes a mechanism with degrees of freedom in radial (R), angular (⊖) and vertical (Z) directions and having a robot arm with a vacuum or edge-gripping wand. The robot must be able to pick up wafers from a storage cassette and then transfer them to a designated station or a plurality of stations where the wafer will undergo some arbitrary process such as heating or alignment. In order to perform these actions, the robot must have precise knowledge of the R, ⊖ and Z positions of the wafer at all cassette and station locations. A robot control system must provide the aforesaid knowledge to position the robot arm and thus the gripped wafer precisely within a cassette or process station for each robot function.

In a typical wafer handling layout the general geometry of both the robot and the various process stations such as the cassette stand are known, and the dimensional relationships between the robot and each station are known within nominal tolerances (e.g.=0.05 inches) available from CAD drawings or manual measurements. When in use, however, the robot must be controlled to move wafers within extremely close tolerances in order to assure that the robot system operates properly without damaging any system component or the wafer being handled.

To provide proper operation of the robot system when initially set up or when restarted after replacement of a component or when a process location has been changed, the robot must be programmed or "taught" so that for each operation phase, the robot arm is positioned precisely at the proper location for the desired function. Heretofore, this initial and/or subsequent programming or "teaching" step was accomplished manually by trained personnel using visually estimated trial and error adjustments of the robot mechanism and control.

For example, using conventional controls, a robot was heretofore installed and "taught" by jogging the robot around and, at each process station, recording wafer placement locations with a teach pendant. Besides consuming many hours, this manual procedure introduced subjectivity and thus a significant possibility for errors since no two technicians could set the same positions. This created a problem of reproducibility, that is, of setting the robot in a precise predetermined position for each of a multitude of cycles. Whenever a wafer cassette is not perfectly positioned within specifications or a machine component wears, settles or malfunctions and requires replacement, the robot must be re-taught because it cannot adapt to such variations. If the robot is not re-taught properly within close tolerances, serious damage or loss of expensive wafers could result.

In copending U.S. patent application Ser. No. 09/270,261, filed Mar. 15, 1999, an automatic calibration system for robots is disclosed wherein sensors were employed on both the robot and also on the cassette or process station in which the wafer was to be placed. Although the aforesaid system has been successful in solving the automatic calibration problem, the necessity to provide sensors tended to increase the cost of the system as well as entailing other disadvantages. For certain applications the aforesaid system also provides superior results but in other applications of the technology, the present invention offers a superior solution to the aforesaid system. For example, in some environments sensors cannot be used.

It is therefore a general object of the present invention to provide an alternative method and apparatus to the aforesaid sensor system which is often an improved system from the perspectives of cost or reliability. The present invention does not require sensor components and moreover, will operate reliably and continuously for multitudes of cycles and within close tolerances to manipulate wafers from cassette holders to various process stations without any damage to wafers.

Another object of the invention is to provide an automatic calibration system for one or more degrees of freedom of a robot (namely R, ⊖ or Z) while employing the aforesaid sensor system for the balance of the degrees of freedom. For example, the present invention could be used to automatically calibrate the R and ⊖ axes of a given robot while the aforesaid sensor system could be used to calibrate the Z-axis.

Further objects of the invention are to provide a wafer-handling automatic calibration system that will automatically calibrate and adjust a wafer handling robot in a relatively short time, for example, after robot components have been removed and replaced.

Another object of the present invention is to provide an automatic calibration system that utilizes a motion control system that can digitally measure the velocity of a servo axis and, based upon this velocity signal, determine when the servo-driven axis begins to collide with the part of the target machine to which the robot is referencing.

Another object of the invention is to provide an automatic calibration system for a wafer handling robot which utilizes a machine controller that is programmed to utilize known dimensional data as well as robot motor velocity changes which occur when the robot touches structural features of a process station for controlling robot movements to precise wafer contacting locations.

Still another object of the invention is to provide a robotic wafer handling system having improved reproducibility of the position of the wafer holding wand in the locale where a semiconductor wafer is placed or removed from an enclosure by virtue of the known dimensional data of the wand and features of the enclosure as well as motor velocity inputs from the robot which are processed in a motor controller for controlling robot movement to precise wafer contacting locations.

SUMMARY OF THE INVENTION

In accordance with the principles of the invention a touch calibration method and apparatus is provided which enables a multi-axis robot machine to automatically precisely locate physical, fixed objects within its working envelope without the use of any sensors. The invention is particularly suitable for robotic applications where the multi-axis robot operates within a defined environment and moves to or interacts with various locations (each location is referred to as a station). This touch calibration method enables the robot to automatically locate the stations with high precision by touching distinct physical features on each station. The features are chosen such that the motion to locate each one is isolated to one axis in order to ensure an unlinked, independent coordinate. Each feature has a known geometry to the point of interaction between the robot and the station, as well the geometry between the robot's contact point and the point of interaction with the station. To ensure axis independence, the order in which these features are located is important.

A system embodying principles of the invention such as a semiconductor fabrication system, is composed of a multiple axis robot operating within a defined environment, and a machine controller which employs closed loop servo motor control and is directly connected to the robot motors. Each robot motor or robot which moves an actuator to touch various objects is a servo motor connected in a closed loop fashion. Attached to each motor is a rotary position encoder that produces two signals in quadrature. The machine controller used in the present invention employs the method and apparatus of U.S. Pat. Nos. 4,639,884 and 5,062,064 in order to determine the velocity of these motors. In the process of achieving a desired motor velocity, the machine controller applies a torque to the motor that is related to how the measured velocity of the motor (using the above method and apparatus) varies from the desired velocity of the motor. Since motor torque is proportional to motor current in a servo motor, the machine controller employs a power amplifier that can establish a desired current in the servo motor. This process of measuring the velocity of the servo motor and then calculating the amount of torque to apply to the motor to effect the desired velocity of the motor is called closed loop control. This loop is closed approximately 2,000 times per second for each motor.

In a typical semiconductor fabrication layout, the robot is fixed to a suitable base structure relative to one or more wafer processing stations including at least one multi-wafer storage cassette stand. The relative geometrical location of both the robot and the stations as well as rough dimensional relationships are known from CAD drawings or manual measurements and this data is stored in the machine controller. Before the fabrication unit can operate, it must be calibrated so that the robot actuator, namely its end member will move precisely within close tolerances to each processing station or cassette on a continuous basis so that the semiconductor process is completed properly and no wafers are damaged.

In the present invention, the machine is programmed to intentionally drive a part of a robot arm until it very gently collides with a known feature of the station or cassette. The controller attempts to drive the robot arm into the obstruction very slowly, and it also attempts to quickly determine just when the robot arm has collided with the station. The principle here is that some amount of motor torque is required to move the arm through free space. There are variations in motor torque based upon non-uniform friction in bearings, belts, screws, etc. When the robot arm hits the obstruction, however, the motor driving the robot arm slows down. Thus, the first indication that the controller has that the arm has hit an obstruction is that the servo motor begins to slow down. However, at the very first decline in velocity, the controller cannot tell whether this decrease in motor velocity is a result of hitting an obstacle or is a normal variation in the friction of bearings, belts, screws, etc. Thus, the controller will slightly increase the motor current and thus increase the servo motor torque slightly. As stated before, this closed loop calculation is performed frequently, often two thousand times per second. Upon subsequent calculations of the servo motor velocity and torque, the controller will have additional information as to whether the robot arm has contacted an obstruction. If the motor velocity again begins to increase, then the controller can deduce that it was friction and not an obstruction that caused the need for more motor torque. If, however, the servo motor continues to slow down, even with increased motor torque, then the controller deduces that the robot arm has hit an obstruction and the controller notes the current motor position while simultaneously decreasing the servo motor torque in order to insure that the collision of the robot arm with the tool is gentle.

Using the aforesaid touch control principles employing the machine controller and a connected multi-axis robot, the automatic calibration of one or more axes of the robot is achieved as follows: Before a calibration sequence proceeds, the dynamic background torque is preferentially measured for each robot axis to be touch calibrated. (Although this step is not required, it generally provides for better calibration accuracy.) The dynamic torque is measured by moving the robot to a safe area where it can make short movements without hitting any objects. In a one-by-one fashion, each motor, for the axis to be touch calibrated, is commanded to make a constant velocity move (this velocity preferably is the same velocity used when performing the calibration step). When the axis has reached this constant velocity (that is, it is finished accelerating) the machine controller samples the current, average motor torque. This average is made up of a large number of instantaneous motor torques, each such torque being the output of the aforementioned closed loop control. When done, the background torque value is determined by taking the straight average of these samples. The constant sampling frequency and the numbers of samples taken is dependent upon the machine design and the environmental characteristics.

In sequence, the background torques are preferably measured for all axes to be automatically touch calibrated. All three axes, R, $\ominus$ and Z may participate, or only one or two axes if the other axes will employ automatic calibration using the principles of the aforesaid sensor system. This background torque measurement step is preferred but may be eliminated. However, if not used, calibration accuracy will likely not be optimal.

During the background routine, torque samples are taken in rapid succession and then averaged. A common sample size might be 100 measurements. The average background torque would therefore be 1/100 of the total value. The system is now ready to calibrate the individual structural features of a particular process station such as cassette stand using the geometry of the rough relationship between the robot and station which is known from CAD drawings or manual measurements and stored in the machine controller.

During a typical calibration procedure, the robot is programmed to touch pre-selected structural features on the target station for each motor axis to be touch calibrated and thereby precisely locate each feature. The controller then utilizes the data from a plurality of feature locations to calculate and establish the precise calibrated position for the robot wand for each of its three axes. Thus, the R and $\ominus$ axes might be calibrated using touch calibration while the Z-axis could use a wand-mounted sensor in the fashion of the aforesaid sensor system. Alternatively, all three axes, the R, $\ominus$ and Z might be calibrated using touch calibration. When all calculations are completed, the robot wand can be directed to the precise position for engaging a wafer within the process station or cassette stand.

Other objects, advantages and features of the inventions will become apparent from the following detailed description taken in conjunction with the drawing.

DETAILED DESCRIPTION OF EMBODIMENT

Figure 1:
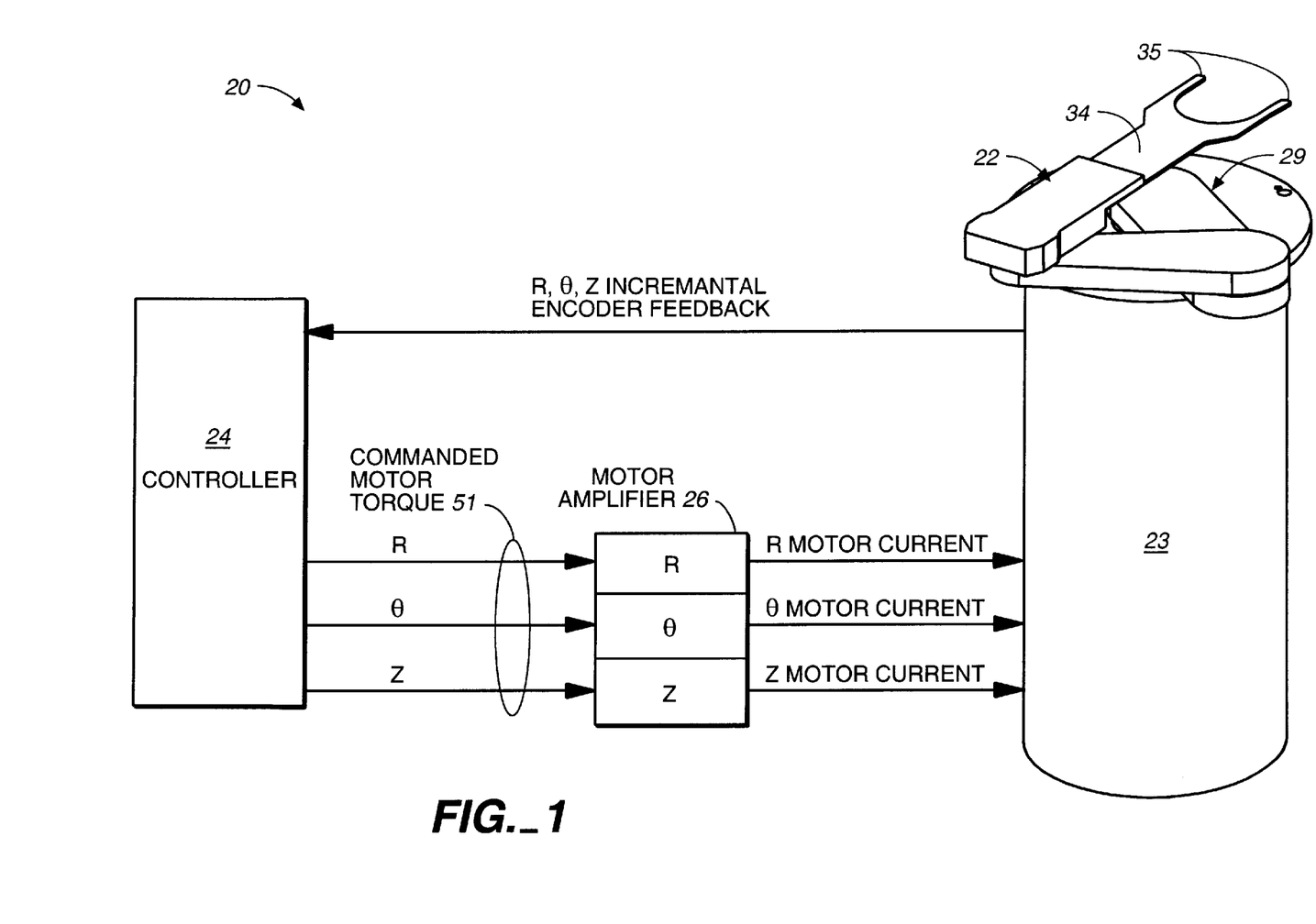
FIG. 1 is a diagrammatic view of a wafer handling robot system that provides automatic calibration in accordance with principles of the present invention.

With reference to the drawing, FIG. 1 shows diagrammatically a semiconductor wafer handling apparatus 20 including a robot 22 that utilizes an automatic calibration system embodying principles of the present invention. The robot has a main body 23 that may be installed in a suitable fixed base support and is electrically connected to a machine controller 24 whose output signals are fed to a motor amplifier 26 comprising separate components for R, $\ominus$ and Z motor axes.

Figure 2:
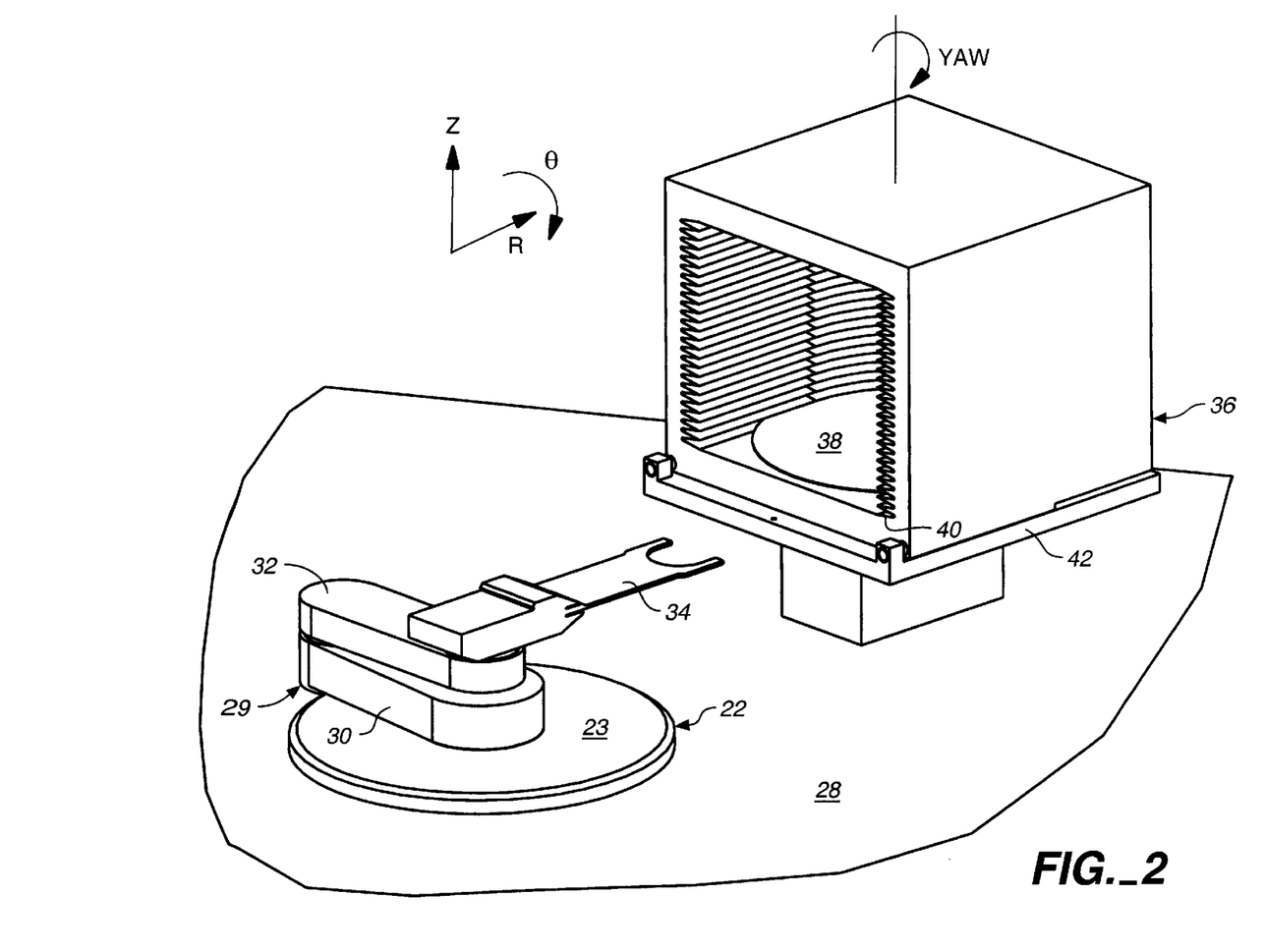
FIG. 2 is a diagrammatic view in perspective showing a robot positioned relative to a cassette stand.

As shown in FIG. 2, the robot 22 has three degrees of movement in the radial (R), angular or theta ($\ominus$) and vertical (Z) direction. Generally, the robot body 23 is fixed to a base support 28 and from the body is cantilevered an articulated robot arm 29. The latter is comprised of a first robot arm section 30 to the end of which is a second pivotally connected outer arm section 32. Pivotally attached to this outer arm section 32 is a wand or end-effector 34 whose outer end is generally y-shaped with spaced apart fingers 35. Vacuum ports (not shown) are usually provided on the wand which enable it to retain a semiconductor wafer in order to pick up and transport the wafer from a cassette to a process station and vice-versa. If desired, an edge-grip type wand, which is well known in the art, may be used having extended fingers (not shown) which are provided to grasp the wafer at a plurality of points around its edge. The invention is not limited to a particular type of wand.

Within the body 23 of the robot are three motors (not shown) that control the movement of the wand 42 in the three axes (R, $\ominus$ and Z). Details of the drive connections for these motors are not shown since they are well known to those skilled in the art. The robot 22 is of a type that is commercially available and also has a vacuum solenoid valve, a vacuum present sensor, and an R axis home switch. Other types of robots with different motor arrangements for moving its articulated arm 29 could be used within the scope of the invention. In the robot arm shown, as the robot's Z axis motor moves, the entire robot arm 29 translates vertically along the Z axis. The theta ($\ominus$) axis motor causes the arm 29 to move angularly about the Z axis and the R motor causes the wand 34 to move radially along the R axis that extends longitudinally through the centerline of the robot.

Characteristics of the aforesaid motor drive system may be modified within the scope of the present invention. To provide certain alternative embodiments for different calibration applications, for example, as disclosed in the aforesaid co-pending application for the sensor calibration system, a wand-mounted laser sensor may be provided to automatically calibrate the Z-axis of robot travel, whereas one or two sensors must be installed in order to automatically calibrate the R and $\ominus$ axes. In accordance with the present invention, such a sensor calibration wand could be used for one axis (e.g. the Z axis) in combination with the present touch calibration system being used for the other axes. This would enable a screw type mechanical drive to be used for the robot Z-axis which may result in higher sensing forces during touch calibration because of its higher effective gearing. Using the laser sensor on the wand for this one Z-axis automatic calibration, while employing touch calibration on the R and e axes which are driven using less geared belt-type drive systems will yield a system that balances cost, complexity, reliability and accuracy.

In a typical wafer handling apparatus shown in FIG. 2, the robot 22 is mounted on the base support 28 within proximity to a cassette stand 36 so that its extended arm 29 can reach and access a wafer 38 therein. The cassette stand 36 is shown as being representative of a typical process station in a wafer handling system. Other forms of process stations could be used with the robot such as those comprising a housing with a slotted opening for the robot. As previously stated the purpose of the robot is to move its articulated arm to a precise location within the process station to either pickup or remove a wafer or to deposit a wafer within the process station. The present invention provides a method for automatically calibrating the robot so that it will provide the precise control necessary on a continuous repetitive basis.

In accordance with the principles of the present invention, automatic calibration of the robot is accomplished by programming the robot to first extend its arm 24 to touch various preselected structural features or locations on the process station such as the cassette stand 36. The station coordinates of these features on the cassette relative to the robot are known, based upon data from CAD drawings or manual measurements and these coordinates are stored within the controller memory. Precise data relating such feature locations to the robot body are obtained when these features are physically touched by the robot wand. This precise data is processed by the controller to ultimately control the movement of the robot arm in all three of its axes so that its end wand 34 will move to a precise location relative to the wafer being handled.

Thus, the present invention provides a touch calibration method which enables a multi-axis robot machine to automatically precisely locate physical, fixed objects within its working envelope without the use of any sensors. This method is particularly suited towards robotic applications where a multi-axis robot operates within a defined environment and moves to or interacts with various process station locations. It enables the robot to automatically locate these stations with high precision by touching the aforesaid known and distinct features on each station. The features of each station are chosen such that the motion to locate each one is isolated to one robot axis; this ensures an unlinked, independent coordinate. Each feature has a known geometry to the point of interaction between the robot and the station, as well the geometry between the robot's contact point and the point of interaction with the station, which is also known. To ensure axis independence, it will be seen that the order in which these features are located is important.

A general first step of the present automatic calibration method which is preferred in order to achieve optimal accuracy is to accurately quantify the dynamic background motor torque for each axis of the robot to employ touch calibration. The second step generally involves isolating one axis to move a part of the robot towards the desired feature of the process station while monitoring the motor torque of the axis to sense when the robot touches the feature on the target station. A third step which is necessary in certain cases is to touch another known feature with the same axis but by moving the robot arm from the opposite direction. The third step is useful for mechanisms with semi-rigid drive trains and is used to account for the flexibility of the drive train.

Figure 10:
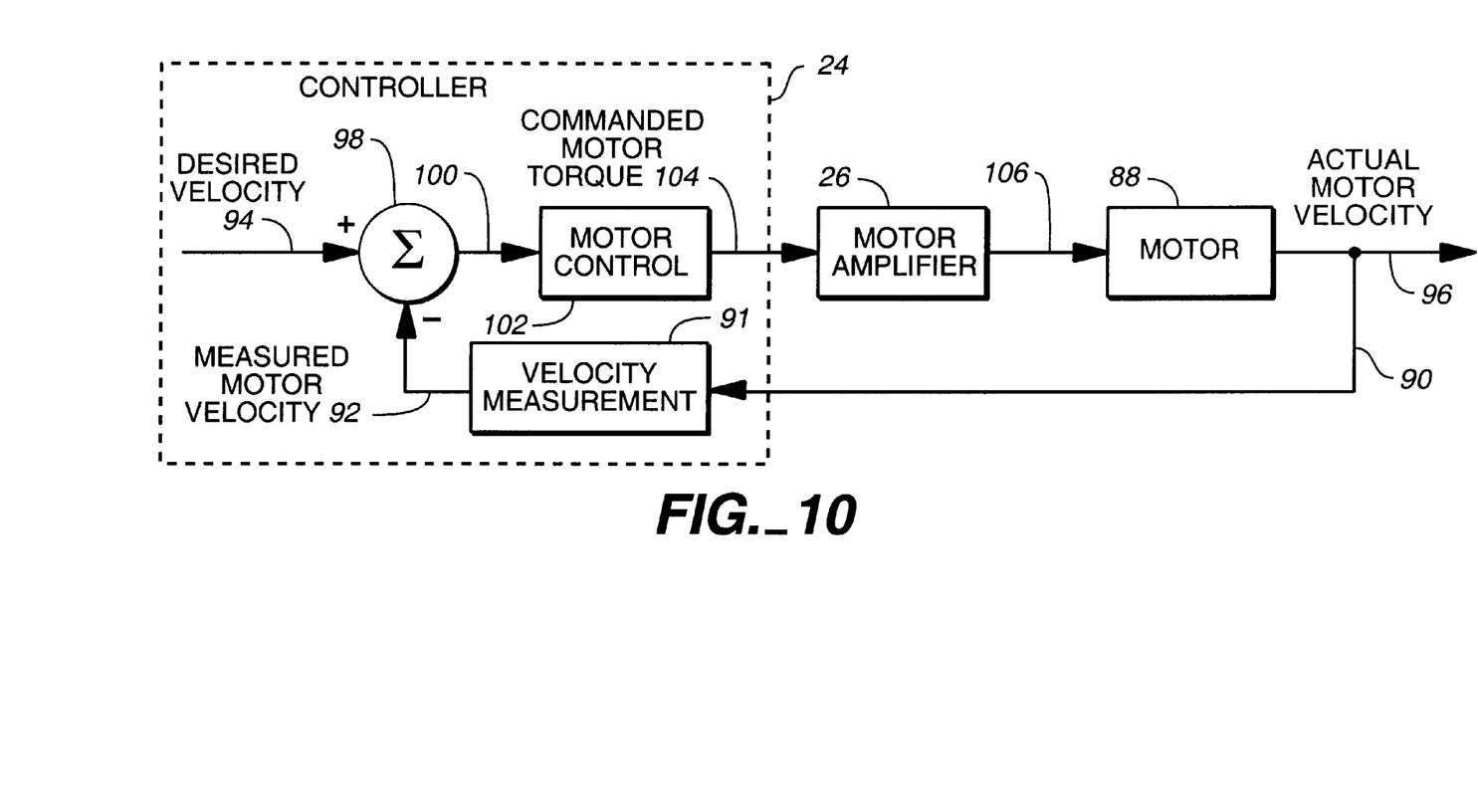
FIG. 10 is a block diagram illustrating the closed loop motor control arrangement used in the present invention.

In accordance with this invention, the concept of motor torque is defined by the method in which the machine controller 24 employs closed loop servo motor control. Each motor 88 of the robot 23 which moves the actuator 34 that touches various objects is a servo motor 88 connected in a closed loop fashion, as depicted in FIG. 10. Attached to each servo motor 88 is a rotary position encoder that produces two signals in quadrature in lead 90. The controller 24 utilizes the quadrature data and employs the method and apparatus of U.S. Pat. Nos. 4,639,884 and 5,062,064 in a velocity measurement element 91 to determine the measured motor velocity 92 of these motors. The controller 24 is programmed to establish a desired velocity 94 that the motor is to achieve during the touch calibration process. In the process of achieving the actual motor velocity 96, the controller 24 computes the difference between the desired velocity 94 and the measured motor velocity 92. This difference, determined by the summing element 98 is the error in velocity 100. This error is applied to the motor control circuit 102. The motor control circuit 102 computes the amount of current to be applied to the motor 88. This commanded motor torque 104 is the value used in the touch calibration process and is applied to a motor amplifier 106 which generates a current 108 to the motor 88. This current 108 causes the motor 88 to rotate and produce the actual motor velocity 96. Thus the servo loop is closed. This process of measuring the velocity of the servo motor and then calculating the amount of torque to apply to the motor to effect the desired velocity of the motor is called closed loop control. In the present invention, this loop is closed approximately 2,000 times per second for each motor.

Figure 3:
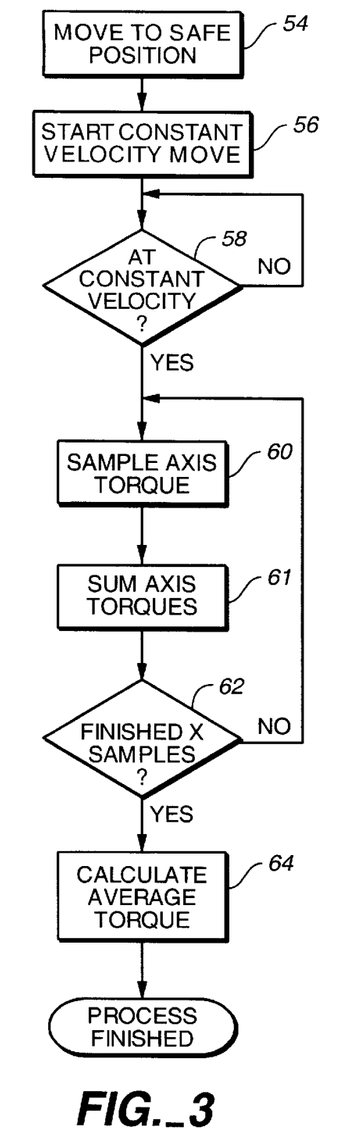
FIG. 3 is a flow diagram showing the steps for determining dynamic background motor torque.

As a preferred preliminary procedure in the present method, determination of the dynamic background torque can be made to improve touch calibration accuracy and must be found independently for each axis. FIG. 3 is a flow diagram showing the steps of the above-described procedure for the determination of dynamic background motor torque. In this procedure, the robot arm is moved to a safe position area 54 where it can make short moves through free space, without contacting any objects. In a one-by-one fashion, each motor, for each axis to employ touch calibration, is commanded to make a constant velocity move 56, using the same velocity to be used subsequently when doing a feature location. When the axis has reached this constant velocity 58 (finished with acceleration) the controller 24 takes multiple samples 60 of the current motor torque. When done, the background torque value is determined by taking the straight average of these samples 64. The constant sampling frequency and the number of samples taken is dependent upon the machine design and the environmental characteristics. The number of samples needs to be large enough to capture the full range of the dynamic torque of the axis during constant velocity at that speed. The full range refers to the peaks and valleys of torque associated with the specific robot arm mechanism. During motion, mechanical components such as bearing, belts and ball screws have non-uniform frictions which will cause torque variations during a constant velocity motion. In some cases, where the machine's dynamics varies greatly from station to station, localized, dynamic background torques may be required. A localized characterization is one that is taken near the feature being located on a particular station.

Measuring background torques, whether local or at a distance, is an optional step and may or may not improve the accuracy of the calibration. If a background torque is available, it should be possible to reduce the force generated during the intentional collision of the robot wand and the station. The method and apparatus of this application will function without an a priori measurement of these background motor torques, but the preferred embodiment uses this background torque measurement given its potential for lower touch calibration force at only a slight increase in robot movement times.

Figure 4:
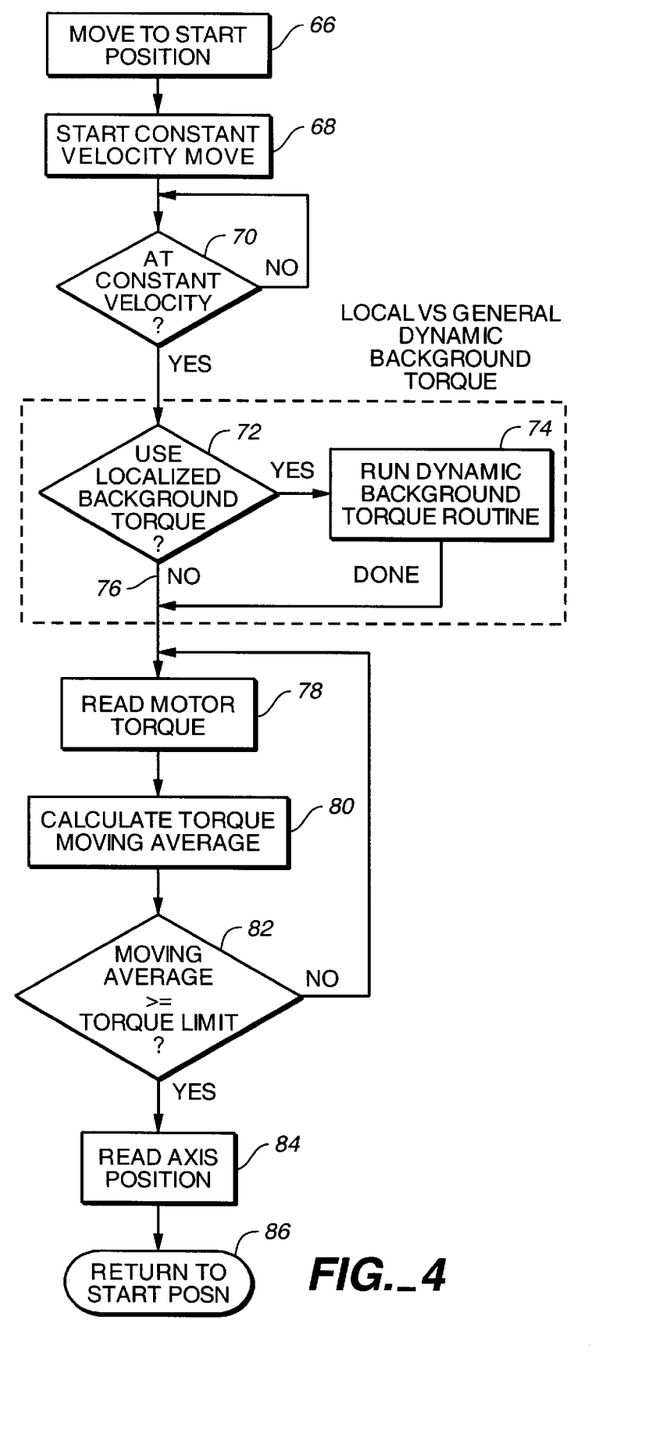
FIG. 4 is a flow diagram showing the step for determining object sensing during a feature touching procedure.

Once the dynamic background torques have been quantified, and stored in the memory of the controller, the system can proceed to the second step which is to locate the station features of the target station. To begin as shown in FIG. 4, the robot is programmed to move to a position 66 such that a normal velocity move of the desired axis will cause the robot to move towards and contact the desired feature. This move is now commanded 68. The controller preferably waits until the slew velocity has been reached before continuing 70. In cases where a localized background torque is desired 72, that routine is now run 74. After the background torque has been determined 76, torque samples 51 are taken at a constant frequency 78 (obtained by the closed loop system (FIG. 10)) and a moving average of this torque is maintained 80. A touch is sensed when this moving average equals or exceeds the torque limit 82. Once the contact has been sensed, the current axis position is captured for this feature 84. Lastly, the axis is moved away from the contact 86.

The sampling frequency and number of samples for the moving average depend upon the machine design. The torque limit equals the dynamic background torque plus the threshold limit. The threshold limit is a value that is chosen such that it is larger than the torque variations experienced while moving at the touch sensing slew velocity. During the routine to quantify the dynamic background torque, the statistical variation of the torque samples is calculated, and the threshold value is determined to be a multiple of this. The flow diagram of FIG. 4 shows the above described process.

Figure 11:
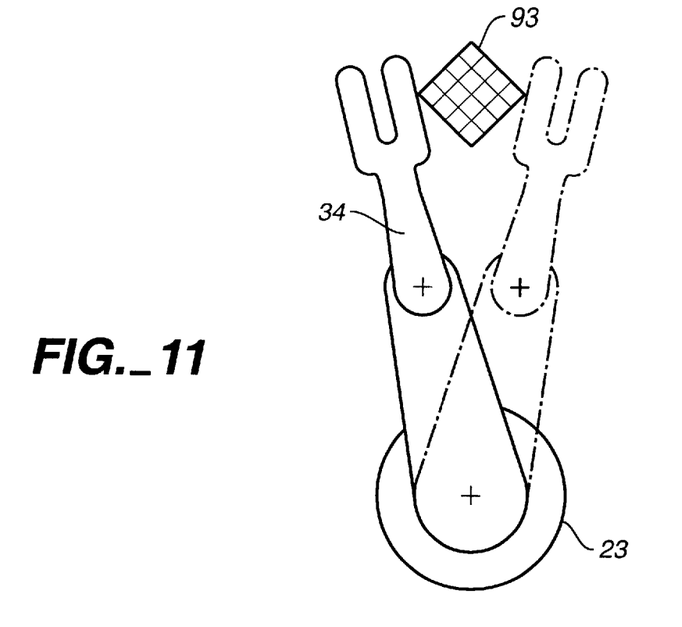
FIG. 11 is a diagrammatic plan view showing how an object may be touched by a robot end-effector from two directions in order to cancel effects of a semi-rigid drive train.

Most machines have semi-rigid drive trains. To accurately find a feature, while using touch calibration, it is very important to take this flexibility into account. The effects of the drive train flexibility can be cancelled if a feature is touched by axis moves of the robot arm coming from two directions. This means that in one case a positive velocity (or direction) move is made to determine a feature's position, then a negative velocity (or direction) move is made to determine the same feature, as shown in FIG. 11. Here, the first touch of a structure 93 is made by the robot end-effector 34 shown in solid lines and a second touch is made from the opposite side as shown in dotted lines. Touching an object from two directions in this manner will cancel the effects of a semi-rigid drive train.

Figure 12:
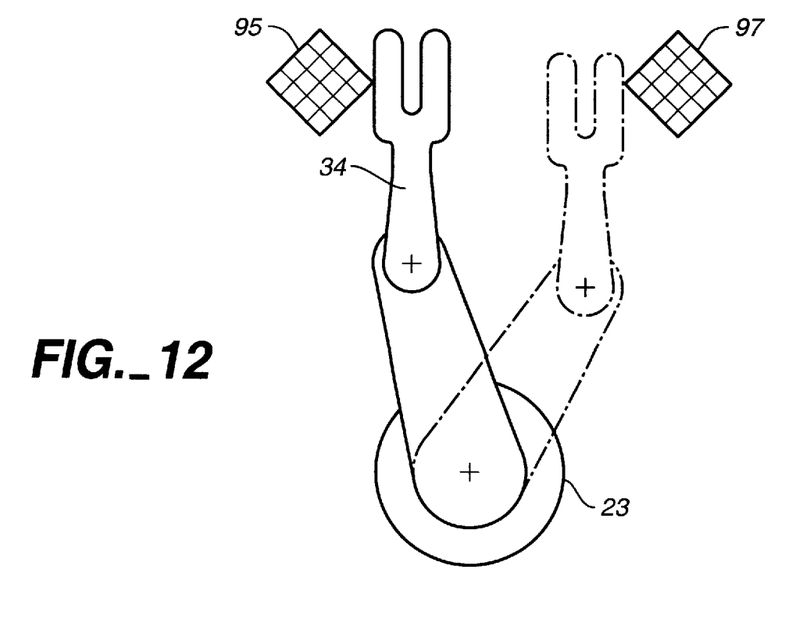
FIG. 12 is a diagrammatic plan view showing how two spaced apart objects can be touched by a robot end-effector with opposite approach paths to cancel effects of a semi-rigid drive train.

In cases where it is not possible to touch a feature from both directions it is possible to use a secondary feature with a known geometry relative to the first as shown in FIG. 12. Here, a first touch is made by the robot wand 34 on the inside of a first of two spaced apart structures 95 and 97 and the second touch is made on the inside of the other structure 97, as shown in dotted lines. Touching these two structures to ascertain the center line between them for example, will cancel effects of a semi-rigid drive train. Once position measurements have been taken for both sides, the non-deflected position can be calculated. The found positions are compared to the known geometry such that the average (or middle) positions are aligned. Now the edge surfaces can be calculated based upon the known geometry.

Earlier, the torque limit was noted as the summation between the background torque and the threshold limit. It is important that this is a summation. A summing value, as opposed to multiplying value, represents a constant applied tension. With regards to a semi-rigid drive train, this reflects an equal tension upon these components when sensing in the positive and negative directions. It is this equal tension which enables canceling the effects of the drive flexibility.

Figure 5:
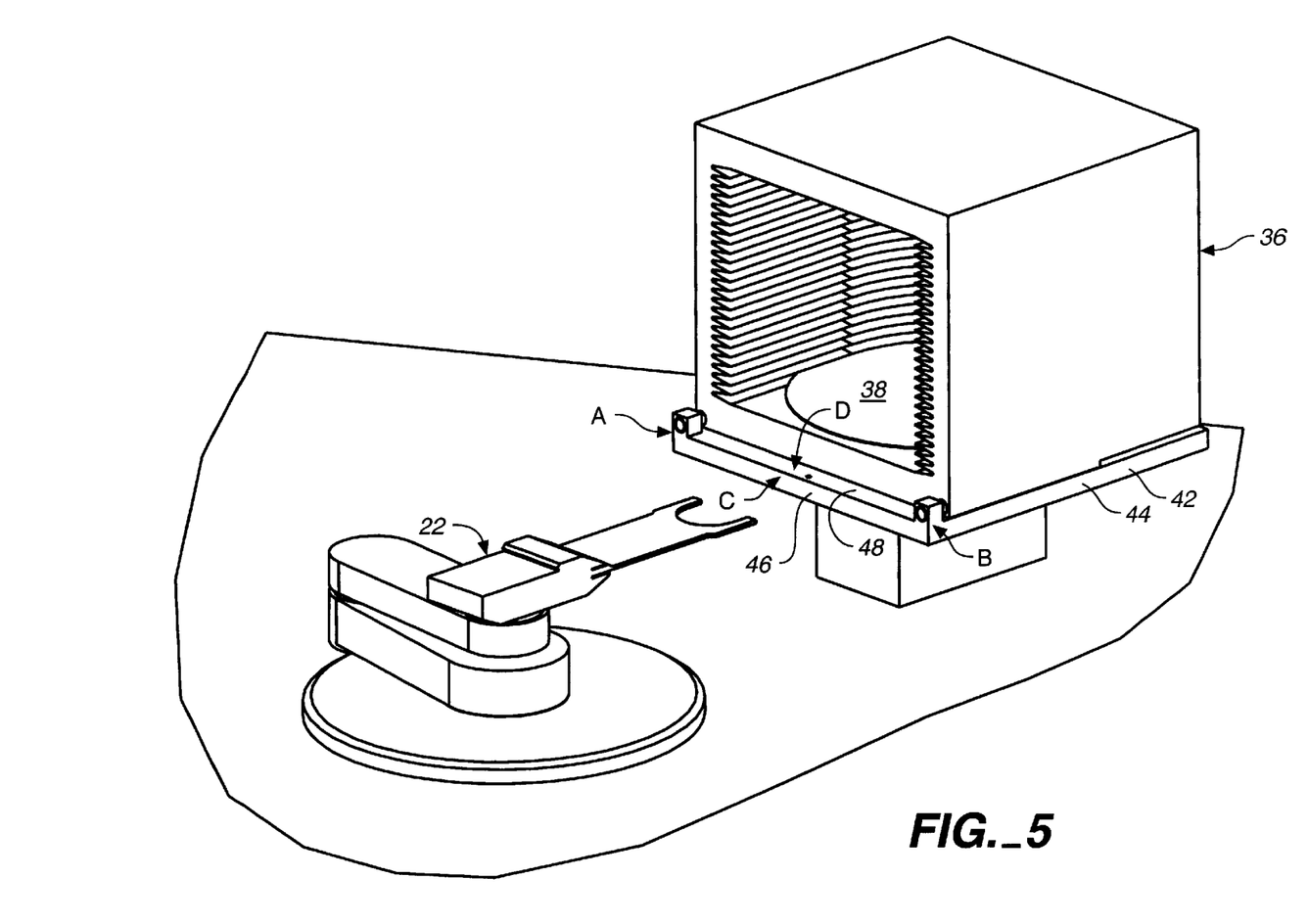
FIG. 5 is a diagrammatic view in perspective of a typical robot positioned relative to a process station or cassette stand with touch features on the station designated.

A more detailed description of the touch calibration method used for a typical robotic application for a wafer handling system is shown in FIG. 5. Here, a typical robotic setup includes a multi-axis robot 22 mounted in a known working environment with a single station. On this station is placed a typical wafer cassette 36 having a plurality of slots with a single wafer 38 in it at the bottom most slot 40. The robot has three degrees of freedom defined in a polar coordinate frame: Radial (R), Angular (O), (or Theta) and Height (or Z).

It should be noted that there are several different types of robots that could be used with the present invention. Some robots are designed having one motor per axis. Other robots are designed with one motor per link, so that in order to achieve a single axis move, two (or more) motors need to move in unison. Depending upon the design of the robot, it is important to characterize the axis torques of all motors. With individual motors per axis it simply means monitoring the one motor. In the other case, a good technique is to monitor the summation of the absolute values of the motors torque required to move the axis. In cases where the motor torques vary greatly for a single axis, one technique may be to monitor only one of the motors. The determination of the preferable technique is dependent upon the exact machine design.

Given the simplicity of the working environment, dynamic background torque characterization can be done at a nominal position. This can be done with the robot as was shown in FIG. 4. Sequentially, the robot will characterize Radial, Theta, and Z-axis background dynamic torques. First, the radial axis will be commanded to a constant velocity move and upon reaching slew velocity the dynamic torque is quantified. This axis is now stopped. The same procedure is performed for the Theta (O) and Height (Z) axes. During the background routine, torque samples are taken at a selected frequency (e.g. 50 $H_z$) and the average is taken over a number of points (e.g. 50). The system is now ready to calibrate the individual features of a process station such as a cassette stand 36 having a plurality of slots for retaining wafers.

FIG. 5 shows the external features of the cassette which the robot end effector or wand 34 will touch in order to calibrate the robot for the above station. The cassette is mounted on a station platform 42 which extends outwardly a short known distance from its frontal slotted opening. When starting the touch calibration procedure, the exact feature coordinates of the cassette are not known, but rough numbers for dimensions relative to the robot 22, based upon CAD drawings or manual measurements are stored in the controller 24. In the embodiment of FIG. 5, features A and B which are located on opposite sides 44 of the cassette platform 42 are used to touch calibrate the angular (⊖) position of the station. Feature C is the front surface 46 of the station platform 42 on the cassette, and is used for radial (R) calibration. Feature D includes the top and bottom surfaces 48 of the station platform which are used for the Z height calibration. In order to maintain the independence of the three robot axes, each feature A, B, C and D must be found independently while not moving any other axis.

The order in which the coordinates of the cassette features are found is important but may vary from one type of machine to another. Thus, the robot is, for example, programmed to first determine the Z-height, then in sequence, the rough Radial (R) position, the Theta (⊖) angle, the final Radial (R) position, and finally station yaw. The sequence can be important because successive axis calibrations use information obtained from previous axis calibrations. For instance, without a known Z-height it is not possible to accurately touch either the radial or angular station features. A more detailed discussion follows of the individual feature calibrations.

Figure 6:
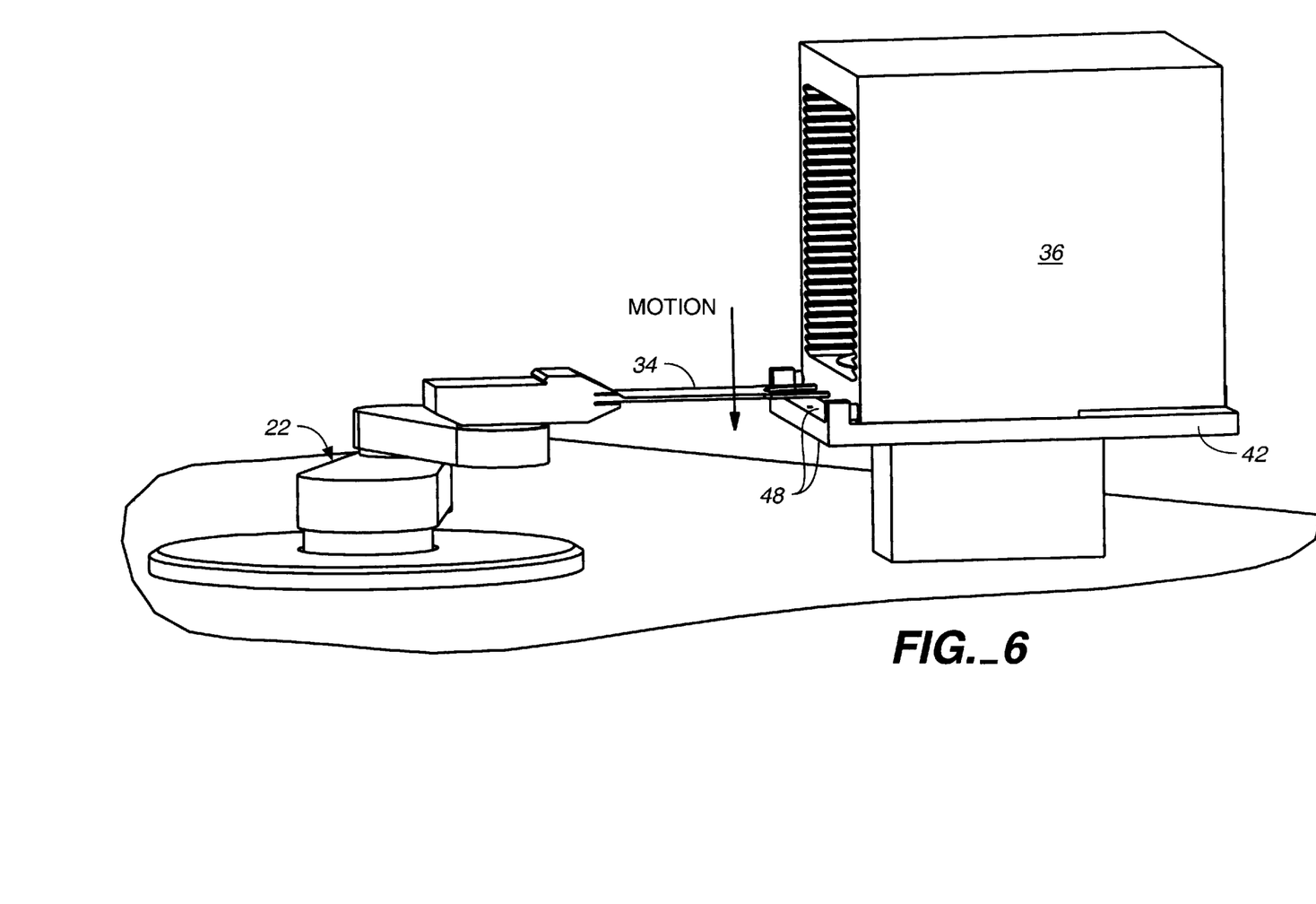
FIG. 6 is a diagrammatic view similar to FIG. 4 showing the touch calibration procedure for the Z-axis.

The Z-height of the station is the first thing to be calibrated. As mentioned previously, the Z-height may often be calibrated using the method and apparatus of the aforesaid co-pending application for the sensor system. Alternatively, touch calibration can be used to determine the Z-axis calibration. For touch calibration, robot 22 is moved to a starting position some distance above the station platform 42 such that a downward motion will cause a contact between the end effector 34 and the top plate 48 of the platform, which is feature D. The robot is now moved down at a constant velocity. FIG. 6 shows the system as the robot is moving down to sense the Z-height of the station top 48. Once the slew velocity has been reached, the controller monitors the Z-axis torque. A moving average is calculated with samples taken at a fixed rate. When the end effector touches the top of the platform 42 the robot motor will require more torque to maintain the same speed, and this will result in an increased axis torque. When the moving average equals or exceeds the torque limit the axis position is captured and stored in the controller 24. The robot is now commanded to move up away from the platform feature. In order to cancel out the effects of the flexibility in the end effector and drive train, the robot is programmed to repeat the procedure to locate the bottom surface of the platform feature D. The touch search from below can start much closer to the actual surface since an approximate value is already known. Given the known thickness of the station plate 42, the exact top surface position (feature D) can be determined by aligning the middle position of the touches and the middle of the plate. Based upon the known geometry, the top surface (feature D) can be calculated.

Summarizing, the calculation of Z Height is as follows:

$$Z_{top\_plate} = Z_{middle} + H/Z$$

Where:

$$Z_{middle} = \frac{(Z_{top} + Z_{bottom})}{2}$$

$Z_{top}$=touched top position
$Z_{bottom}$=touched bottom position
H=known thickness of top plate 42
$Z_{top\_plate}$=the top surface of the station (Feature 4).

Once the Z height is known, it will be possible to determine a rough radial (R) position. The position is rough because when using an approximate angular value the end effector 34 will not press up flat against the station surface. The assumption is that in an ideal setup, the front surface of the cassettes station platform 42 will be perpendicular to the radial axis of the robot. As well, ideally the front of the end effector 34 is mounted such that it too is perpendicular to the radial axis. From these two assumptions, when the robot moves towards the station, at the correct station angle, the end effector will press up flat against the station front surface 46.

Figure 7:
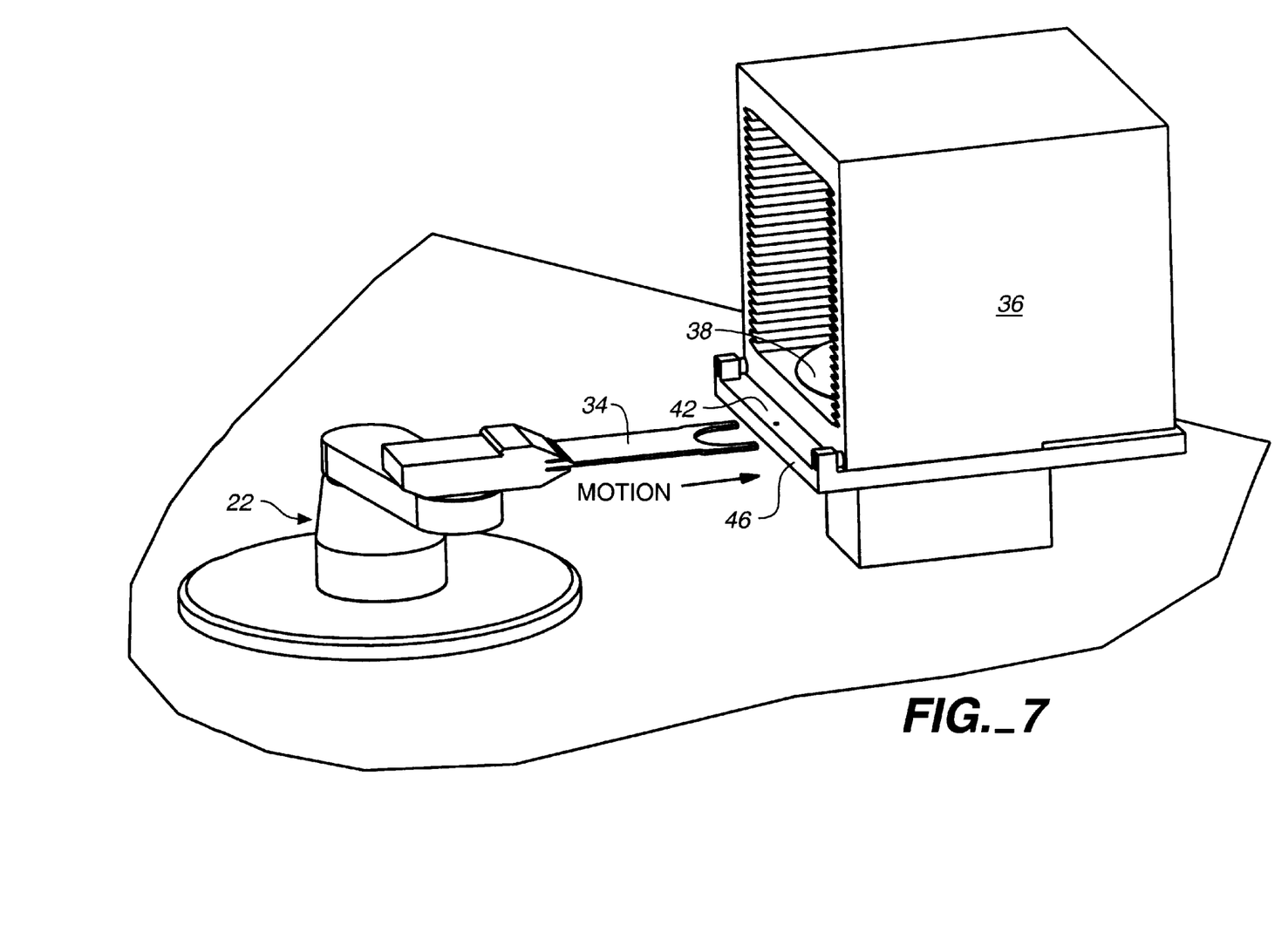
FIG. 7 Is a diagrammatic view similar to FIG. 4 showing the touch calibration procedure for the radial (R) axis.

To begin the radial calibration, as shown in FIG. 7, the robot 22 is moved to a Z-height, a retracted radial position, and an approximate angular orientation such that a direct outward radial motion will cause a contact between the tip of the end effector 34 and the front surface 46 of the station platform 42. FIG. 7 shows the robot during this outward search. Once the slew velocity is reached, the controller 24 monitors the radial axis torque as the robot extends out towards the platform front. Samples are taken at 50 $H_z$ and a 30 point moving average is calculated. When the axis torque passes the torque limit the radial position is captured and stored in the controller memory, and the radial axis is moved back to the retracted position.

Figure 8:
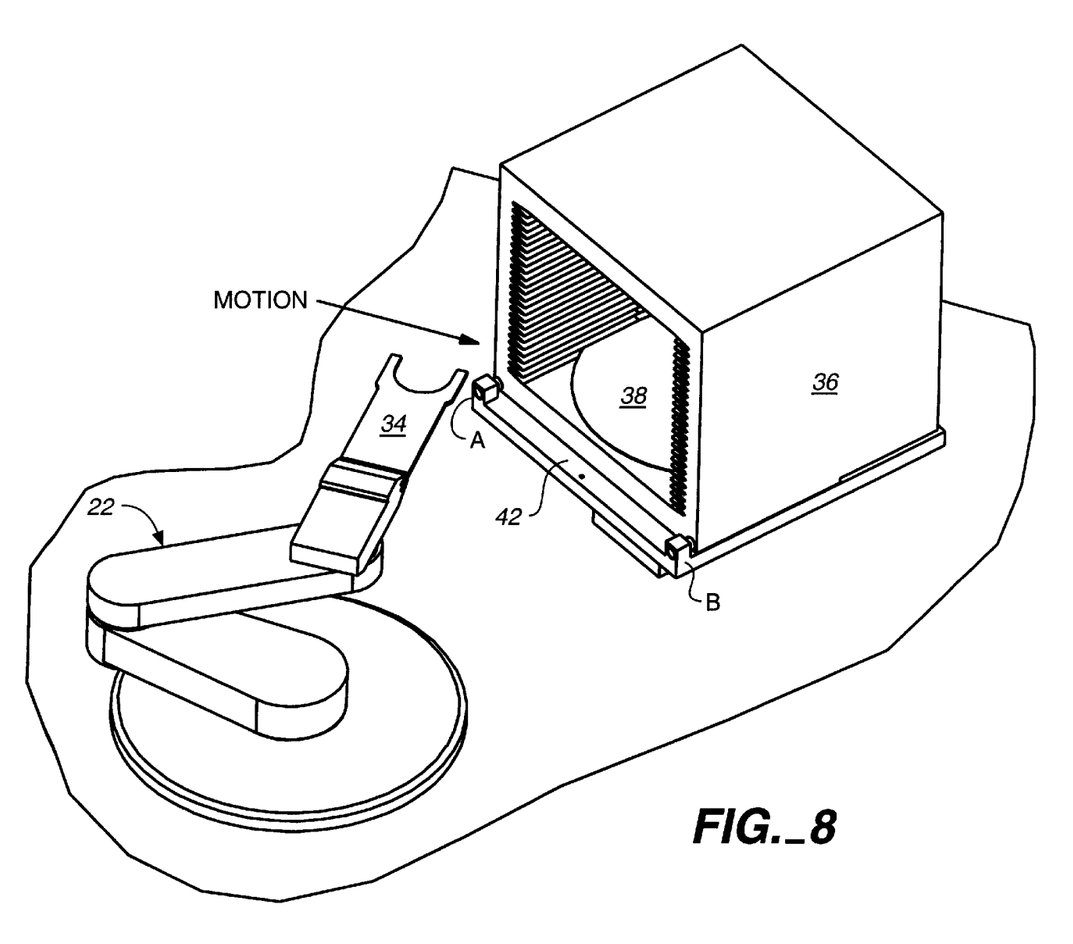
FIG. 8 is a diagrammatic view similar to FIG. 4 showing the touch calibration procedure for the angular ($\ominus$) axis.

With known rough radial (R) and Z-height positions, it will now be possible to move the robot end effector 34 to starting points to the left and right sides of the cassette 36, to contact the station features A & B. FIG. 8 shows the robot 22 as it moves towards the right to locate feature A. After the slew velocity has been reached, a moving average of regularly spaced samples is calculated by the controller. When the axis torque passes the torque limit the current angular position is captured and stored. The same procedure is followed to locate feature B. By locating features A and B and based upon the geometry between them, it is possible to accurately calculate the central angle for the cassette or station 36. Locating the features A and B from the left and right allows cancellation of the effects of a semi-rigid drive train.

The calculation of the angular position e is as follows. For this specific example, the station features A and B are designed to be symmetric about the central axis of the station or cassette 36 such that when touching the Feature A then Feature B on the cassette the average of these two positions gives the middle position of the station which in this case is a line extending through the geometric center of the cassette slot.

Thus: $T_{station\_center} = \frac{(T_{right} + T_{left})}{2}$

Where:
$T_{right}$=touched right position (Feature A)
$T_{left}$=touched left position (Feature B)

Once the theta angle has been determined, a more accurate Radial position (R) can be found. Using the same technique described above, but this time using the calibrated angular position, the true radial position is determined. In addition to using the calibrated angular position, it is possible to start the robot 22 much closer to the front surface 46 by using the previously found radial position. With this calibration, the end effector of the robot will come as flat as it can to the front surface 46 to the platform plate 42 on the cassette 36.

Figure 9:
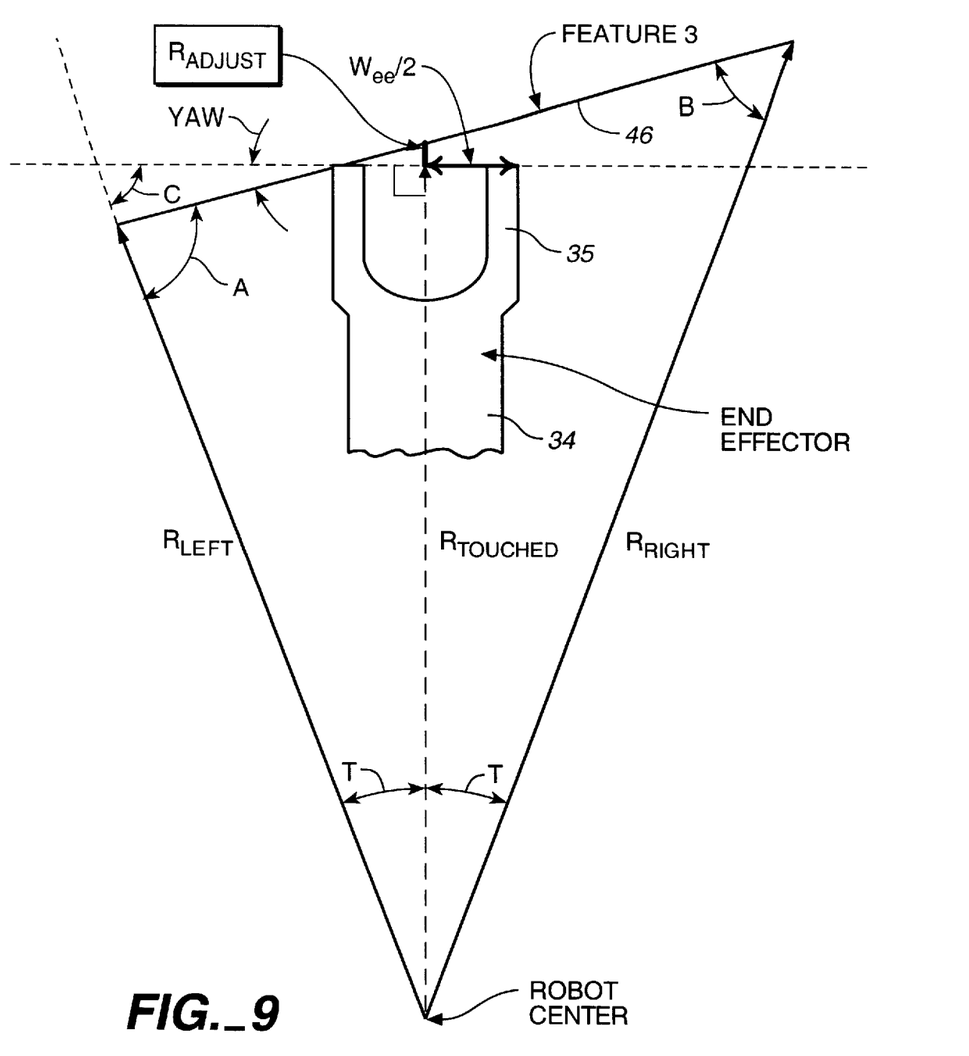
FIG. 9 is an enlarged fragmentary diagrammatic plan view showing the geometrical elements for determining the yaw factor of the robot wand.

The final step of the calibration method, as shown in FIG. 9 is to touch location positions to the left and right radial of the station central angle at a given angle. These calibrations are done to determine the yaw angle of the station. When the station front is exactly perpendicular to the robot radial axis the yaw angle is zero. The yaw is calculated by taking two radial measurements one to the left and one to the right of the found station theta angle. Comparing these two radial values the exact yaw can be calculated. The yaw calculation is a function of the radial locations and the offset angles. The yaw angle is used to adjust the radial positions of the station center.

The calculation of this adjustment is as follows, referring to FIG. 9 for the geometry and notation.

From the above geometry, using a combination of the Law of Sines and Law of Cosines, the angles A and B can be calculated with the equations:

$\tan(A) = R_{right}\sin(2T)$ $R_{left} - (R_{right}\cos(2T))$

B=180-(A+C)

Also, from the above geometry we can generate two equations including the two unknown angles C and yaw.

180=C+yaw+(180-A)

180B+yaw+(180-C)

Solving for both of these equations we find:

$$yaw = \frac{A - B}{2}$$

The dimension that we are most interested in calculating is the Radial adjustment value $R_{adj}$. This is now calculated as:

$$R_{adj} = \frac{W_{ee}}{2}\tan(yaw)$$

Where:
$W_{ee}$=the width of the robot end effector 34.
The actual station center is now calculated as:

$R_{station\_center} = R_{final\_touch} + R_{adj} + R_{surface\_to\_center} + R_{ee\_offset}$ Where:
$R_{surface\_to\_center}$=the radial distance from Feature 3 to the center point of the station. The center point being the point where the wafer centers is located.
$R_{final\_touch}$=the final touched radial position
$R_{ee\_offset}$=the radial offset from the end of the end effector to the point where the wafer's center would be located.

The coordinated values for the above station are now found as: $R_{station\_center}$, $T_{station\_center}$, and $Z_{top\_plate}$ The above illustrates only one example of the steps involved in calibrating a station to a robot. The exact method for each application will vary depending upon the capabilities and axes of the robot as well as the geometry and operational intent of the station. In addition, the reach and abilities of the robot to touch different features is a large factor. In the above case, the radial calibration was not able to make a second reverse tensioned measurement.

Based upon the above procedures the exact radial, theta and height coordinates of the station have been determined. It is now possible to retrieve and place wafers to the wafer cassette.

To those skilled in the art to which this invention relates, many changes in construction and widely differing embodiments and applications of the invention will make themselves known without departing from the spirit and scope of the invention. The disclosure and the description herein are purely illustrative and are not intended to be in any sense limiting.

What is claimed is:

1. A method for automatically calibrating the positioning of a wafer handling robot to a precise, desired location within an enclosure forming a process station having an opening and exterior structural features, said robot having an articulated arm with an end-effector that is movable in the vertical (Z), angular (Θ), and radial (R) directions and is connected to a controller having memory and logic sections, said method including the steps of:

(1)—selecting a plurality of said structural features on said enclosure and storing in said controller, rough distance and geometrical data defining the relative location of said features to said robot;

(2)—programming said controller to cause said robot arm to move toward said process station enclosure in a series of sequential movements, each said movement culminating in said robot end-effector touching a preselected said exterior feature of said process station;

(3)—sensing a signal response when each end-effector touching occurs and storing such data in said controller relative to the location of each said exterior feature when it is touched by said end-effector; and (4)—combining said stored data from each said touching location to compute a precise calibrated target position of said robot end-effector within said enclosure.

2. The method as described in claim 1 wherein said robot is programmed to touch said enclosure in three separate sequences of operation to provide data that determines precisely the vertical (Z), angular (Θ) and radial (R) coordinates of the calibrated target position.

3. The method as described in claim 1 including the step of producing said signal response when torque applied to move the robot arm rises above a predetermined threshold level as the velocity of the driving servo motor axis decreases.

4. The method as described in claim 3 wherein said threshold level of torque is determined by moving said robot arm freely at a predetermined slew velocity without any touching while measuring the torque level.

5. The method as described in claim 3 wherein said controller is of the closed loop type and measures torque of each robot motor by monitoring its axis velocity.

6. The method as described in claim 1 wherein said process station is a cassette stand having a plurality of open slots for returning a semiconductor wafer.

7. The method as described in claim 6 wherein said cassette stand is mounted on a platform member having an extended portion at the open side of the cassette stand, said platform member having features adapted to be touched by said robot wand in order to calibrate said robot.

8. The method as described in claim 7 wherein said features on said cassette stand include a horizontal surface on said platform for determining a vertical (Z) level, a frontal surface on said platform for determining a radial (R) distance, and side surfaces at the opposite ends of said platform for determining an angular (Θ) position for said robot arm.

9. A method for automatically calibrating the positioning of the end-effector of a wafer handling robot to a precise location within an enclosure forming a process or storage station for wafers said enclosure having a frontal opening and exterior structural features, said robot having a fixed body with an articulating arm having said end-effector that is movable in the vertical (Z), angular e, and radial (R) directions and is connected to a controller having memory and logic sections, said method comprising the steps of:

(1)—selecting a plurality of said structural features on said enclosure and storing in said controller rough distance and geometrical data defining the location of said features relative to said robot body;

(2)—programming said controller to cause said robot to first determine the Z-height of said enclosure opening by causing said end-effector to sequentially touch the top surface of a platform structure extending from said enclosure having a known thickness and storing a signal generated by said touching;

(3)—programming said controller to cause said robot to touch a frontal area of the enclosure structure to determine a rough radial (R) position and storing this position in said controller;

(4)—programming said controller to touch sequentially structural locations on opposite sides of said enclosure and thereafter to calculate the calibrated angular position of the centerline of the enclosure opening;

(5)—using said calibrated angular position to determine a more accurate radial (R) position of said end-effector; and (6)—determining the yaw angle of said enclosure relative to said end-effector if the enclosure front is not exactly perpendicular to the radial axis of the end-effector.

10. A method for automatically calibrating the positioning of the end-effector of a wafer handling robot to a precise location relative to a target structure such as a process or storage station for wafers, said robot having a fixed body with an articulating arm with said end-effector at its outer end, said arm being movable in the vertical (Z), angular (Θ) and radial (R) directions and being connected to a machine controller having memory and logic sections, said end-effector having sensor means mounted therein, said method comprising the steps of:

(1)—selecting a plurality of features on said target structure and storing in said controller rough distance and geometrical data defining the location of said features relative to said robot body;

(2)—programming said controller to move in the vertical direction while activating said sensor means to determine Z-height measurements of said target structure and storing said measurements in the controller memory;

(3)—programming said controller to cause said robot to touch a frontal area of said target structure to determine a radial (R) position thereof, and storing this position in said controller;

(4)—programming said controller to touch sequentially locations on opposite sides of said target structure and thereafter calculating and storing a desired calibrated angular position between the touched sides in said controller; and (5)—combining the stored measurements for the Z, R and e axes for establishing a calibrated, precise position of said robot end-effector relative to said structural target.

11. An automatic calibration system for a wafer transport robot having a main body with an articulating arm and an end-effector, said robot having servo motor means for causing its movement in the radial (R), circular (Θ), and vertical (Z) axes, each said servo motor means including means for digitally measuring its axis velocity, controller means for storing instructions for moving said robot end-effector toward a pre-selected target structure, means associated with said controller means for detecting a reduction in the velocity of a servo motor means when said end-effector touches the target structure, and means for recording the precise position of said end-effector at said target structure relative to said main body of said robot when the touching of the target structure occurs and causes the reduction in servo motor velocity.

12. The automatic calibration system of claim 11 including means in said controller for determining a background torque value that establishes a threshold level for facilitating the detection of a touching event by said end-effector on a target structure.

13. The automatic calibration system of claim 11 wherein said servo motor means for said robot comprises a closed loop servo system for each robot axis.

* * * * *